(12) United States Patent
Miyakaze et al.

(10) Patent No.: US 12,080,551 B2
(45) Date of Patent: Sep. 3, 2024

(54) SiC COMPOSITE SUBSTRATE INCLUDING BIAXIALLY OREINTED SiC LAYER AND SEMICONDUCTOR DEVICE

(71) Applicant: NGK INSULATORS, LTD., Nagoya (JP)

(72) Inventors: Risa Miyakaze, Nagoya (JP); Kiyoshi Matsushima, Nagoya (JP); Jun Yoshikawa, Nagoya (JP); Morimichi Watanabe, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 579 days.

(21) Appl. No.: 17/303,967

(22) Filed: Jun. 11, 2021

(65) Prior Publication Data

US 2021/0301422 A1 Sep. 30, 2021

Related U.S. Application Data

(63) Continuation of application No. PCT/JP2020/005741, filed on Feb. 14, 2020.

(30) Foreign Application Priority Data

Mar. 11, 2019 (JP) .................................. 2019-043465

(51) Int. Cl.
*C30B 23/02* (2006.01)
*C30B 29/36* (2006.01)
(Continued)

(52) U.S. Cl.
CPC .......... *H01L 21/0262* (2013.01); *C30B 23/02* (2013.01); *C30B 29/36* (2013.01);
(Continued)

(58) Field of Classification Search
CPC ... C30B 29/36; C01B 32/956; H01L 29/1608; H01L 29/161; H01L 29/66053
See application file for complete search history.

(56) References Cited

U.S. PATENT DOCUMENTS 8,940,614 B2 * 1/2015 Loboda ............. H01L 21/02529
438/481
2007/0101930 A1 * 5/2007 Hallin ..................... C30B 25/02
117/101
(Continued)

FOREIGN PATENT DOCUMENTS

CN 1606140 A * 4/2005 ........... H01L 21/049
JP 2001-158696 A1 6/2001
(Continued)

OTHER PUBLICATIONS

International Search Report and Written Opinion (Application No. PCT/JP2020/005741) dated Apr. 14, 2020.
(Continued)

*Primary Examiner* — Ida M Soward
(74) *Attorney, Agent, or Firm* — BURR PATENT LAW, PLLC

(57) ABSTRACT

A SiC composite substrate includes a SiC single crystal layer and at least one biaxially oriented SiC layer. The at least one biaxially oriented SiC layer is disposed on the SiC single crystal. In the biaxially oriented SiC layer, the SiC is oriented in both a c-axis direction and an a-axis direction. The biaxially oriented SiC layer has pores and has a density of defect reaching the surface of $1.0 \times 10^1/cm^2$ or less.

4 Claims, 4 Drawing Sheets

(51) Int. Cl.
  *H01L 21/02* (2006.01)
  *C01B 32/956* (2017.01)
  *H01L 29/16* (2006.01)
  *H01L 29/161* (2006.01)
  *H01L 29/66* (2006.01)

(52) U.S. Cl.
  CPC .. *H01L 21/02378* (2013.01); *H01L 21/02433* (2013.01); *H01L 21/02529* (2013.01); *H01L 21/0259* (2013.01); *H01L 21/02609* (2013.01); *C01B 32/956* (2017.08); *H01L 29/1608* (2013.01); *H01L 29/161* (2013.01); *H01L 29/66053* (2013.01)

(56) References Cited

U.S. PATENT DOCUMENTS

2010/0119849 A1* 5/2010 Nakamura ........ H01L 21/02378
                                                                  428/446
2015/0333125 A1* 11/2015 Loboda ............. H01L 21/02532
                                                                  257/77

FOREIGN PATENT DOCUMENTS

| JP | 2001-158697 A1 | 6/2001 | |
| JP | 2006-036609 A1 | 2/2006 | |
| JP | 2006036609 A * | 2/2006 | ............. C30B 29/36 |
| JP | 6197722 B2 | 9/2017 | |

OTHER PUBLICATIONS

English translation of the International Preliminary Report on Patentability (Chapter I) dated Sep. 23, 2021 (Application No. PCT/JP2020/005741).

* cited by examiner

SiC COMPOSITE SUBSTRATE INCLUDING BIAXIALLY OREINTED SiC LAYER AND SEMICONDUCTOR DEVICE

BACKGROUND OF THE INVENTION

1. Field of the Invention

The present invention relates to a SiC composite substrate and semiconductor device.

2. Description of the Related Art

Silicon carbide (SiC) is receiving attention as a wide bandgap material that can control a high voltage and high electric power with small loss. Representative examples of dislocations present in a SiC single crystal include basal plane dislocations, threading screw dislocations, and threading edge dislocations. The total dislocation density of current commercial SiC single crystal substrates is said to be about $10^3$ to $10^4$ cm$^{-2}$ (for example, PTL 1). Therefore, in contrast to Si whose dislocation-free crystals have been industrially obtained, SiC is a single crystal material in which elements must be produced in regions having a certain dislocation density. It is known that the above dislocations have different influences on element performance.

CITATION LIST

Patent Literature

PTL 1: JP 6197722 B (paragraph 0004)

SUMMARY OF THE INVENTION

As far as the inventors know, a SiC single crystal substrate with an extremely small dislocation density has not been developed.

The present invention has been made to solve the foregoing problem, and it is a main object to provide a biaxially oriented SiC layer having an extremely small defect density.

A SiC composite substrate of the present invention includes:

a SiC single crystal layer; and
at least one biaxially oriented SiC layer disposed on the SiC single crystal, wherein the SiC is oriented in both a c-axis direction and an a-axis direction, and wherein the at least one biaxially oriented SiC layer has pores and has a density of defect reaching the surface of $1.0 \times 10^1$/cm$^2$ or less.

The biaxially oriented SiC layer of the SiC composite substrate has an extremely small defect density and is therefore useful for production of semiconductor devices and electronic devices.

The inventors have found that, when the pores are present in the biaxially oriented SiC layer, the density of defects (such as micropipes, threading screw dislocations, and basal plane dislocations) reaching the surface of the biaxially oriented SiC layer is reduced. Although the reason for this is unclear, the following mechanism is conceivable. One known cause of the formation of defects is thermal stress due to the distribution of temperature in the SiC crystal. When the pores are present, the thermal stress generated during the formation of the biaxially oriented SiC layer may be relaxed, so that the formation of new dislocations may be prevented. Alternatively, the relaxation of the thermal stress in the biaxially oriented SiC layer may facilitate pair annihilation of defects. A second possible cause of the formation of defects is propagation of dislocations present in the SiC single crystal serving as a substrate into the biaxially oriented SiC layer that grows on the substrate. In this case, when the pores are present in the biaxially oriented SiC layer, the dislocations propagating from the SiC single crystal layer may collide with the pores and annihilate. A third possible cause of the formation of defects is the lattice mismatch between the biaxially oriented SiC layer and the SiC single crystal used as a substrate, but this is based on the premise that the biaxially oriented SiC layer is doped with impurities at a high concentration. In this case, when the pores are present in the biaxially oriented SiC layer, the stress due to the lattice mismatch is relaxed, so that the defect density may be reduced.

DETAILED DESCRIPTION OF THE INVENTION

Figure 1:
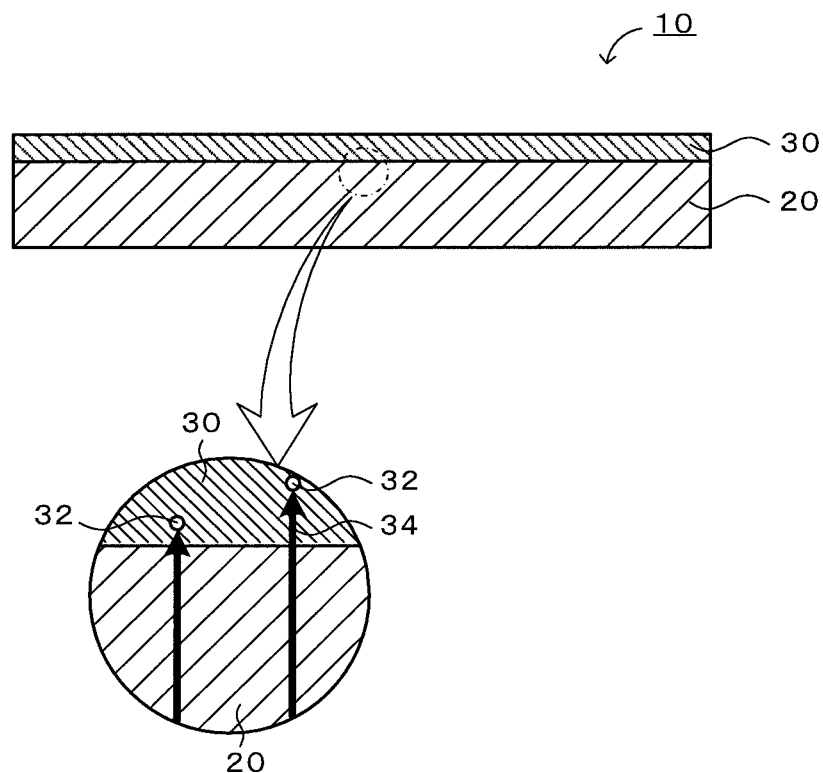
FIG. 1 is a vertical cross-sectional view of a SiC composite substrate 10.
Figure 2:
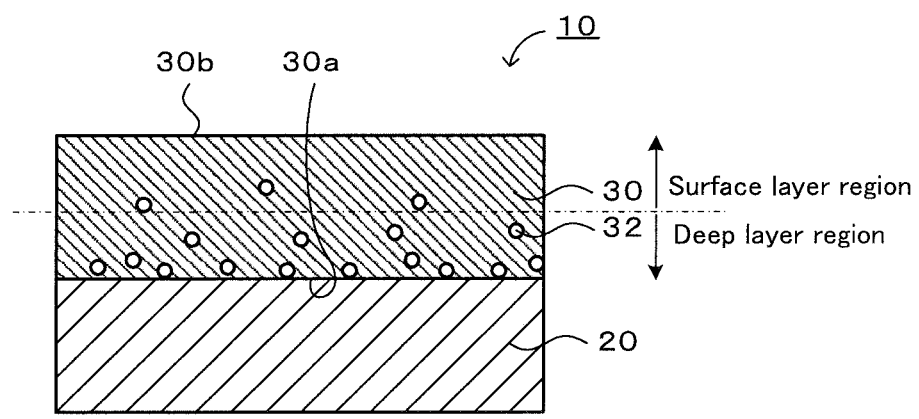
FIG. 2 is a partial enlarged view of FIG. 1.
Figure 3A:
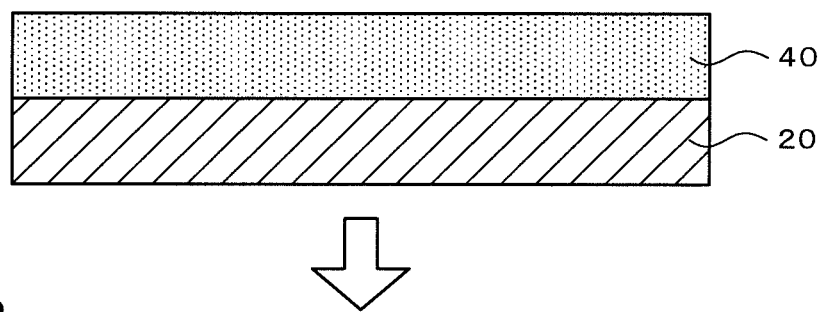
FIGS. 3A to 3C are production process charts of the SiC composite substrate 10.
Figure 3B:
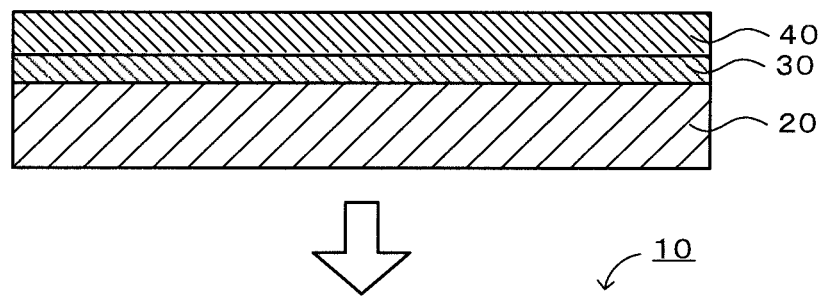
Figure 3C:
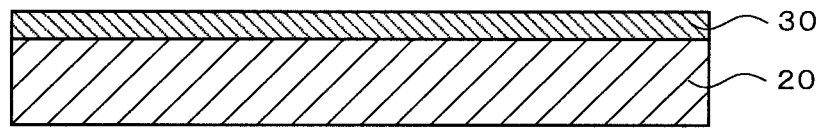

Preferred embodiments of the present invention will be described with reference to the drawings. FIG. 1 is a vertical cross-sectional view of a SiC composite substrate 10 (the cross-sectional view obtained by cutting the SiC composite substrate 10 along a plane including the center axis of the SiC composite substrate 10), and FIG. 2 is a partial enlarged view of FIG. 1. FIGS. 3A to 3C are production process charts of the SiC composite substrate 10.

The SiC composite substrate 10 in an embodiment includes a SiC single crystal layer 20 and a biaxially oriented SiC layer 30.

The SiC single crystal layer 20 is a layer formed of a SiC single crystal and has a crystal growth face. No particular limitation is imposed on the polytype, off-angle, and polarity of the SiC single crystal. The polytype is preferably 4H or 6H, and the off-angle is preferably 0.1 to 12° with respect to the [0001] axis of the single crystal SiC. The polarity is preferably the Si-face. More preferably, the polytype is 4H, and the off-angle is 1 to 5° with respect to the [0001] axis of the single crystal SiC. The polarity is more preferably the Si-face.

The biaxially oriented SiC layer 30 is provided on the crystal growth face of the SiC single crystal 20, and the SiC is oriented in both a c-axis direction and an a-axis direction. The biaxially oriented SiC layer 30 may be a SiC single crystal, a SiC polycrystal, or a mosaic crystal so long as the SiC layer 30 is oriented in the two directions, i.e., the c-axis and a-axis directions. The mosaic crystal is a crystal which does not have distinct grain boundaries but is a collection of crystals whose crystal orientation slightly deviates from one or both of the c-axis and a-axis. No particular limitation is imposed on the method for evaluating the orientation. For example, well-known analysis methods such as the EBSD (Electron Back Scatter Diffraction Patterns) method and the X-ray pole figure analysis can be used. When, for example, the EBSD method is used, an inverse pole figure map of the surface (plate surface) of the biaxially oriented SiC layer 30 or its cross section perpendicular to the plate surface is measured. In the inverse pole figure map obtained, when the following four conditions are satisfied, the biaxially oriented SiC layer 30 can be defined as being oriented in both a substantially normal direction substantially normal to the plate surface and a substantially in-plane plate surface direction: (A) the crystals are oriented in a specific orientation (along a first axis) that extends in the substantially normal direction; (B) the crystals are oriented in a specific orientation (along a second axis) that is orthogonal to the first axis and extends in the substantially in-plane plate surface direction; (C) the inclination angles of the crystals with respect to the first axis are distributed within ±10°; and (D) the inclination angles of the crystals with respect to the second axis are distributed within ±10°. In other words, when the above four conditions are satisfied, the biaxially oriented SiC layer 30 is considered to be oriented along both the c-axis and a-axis. When, for example, the substantially normal direction is aligned with the c-axis, it is only necessary that the substantially in-plane plate surface direction be aligned with a specific orientation (e.g., the a-axis) orthogonal to the c-axis. It is only necessary that the biaxially oriented SiC layer 30 be oriented along the two axis, i.e., the substantially normal direction and the substantially in-plane plate surface direction, and it is preferable that the substantially normal direction is aligned with the c-axis. The narrower the distributions of the inclination angles with respect to the substantially normal direction and/or the substantially in-plane plate surface direction, the smaller the mosaicity of the biaxially oriented SiC layer 30. The closer the distributions of the inclination angles with respect to the substantially normal direction and/or the substantially in-plane plate surface direction are to zero, the closer the biaxially oriented SiC layer 30 is to a single crystal. Therefore, it is preferable from the viewpoint of the crystallinity of the biaxially oriented SiC layer 30 that both the distributions of the inclination directions with respect to the substantially normal direction and the substantially in-plane plate surface direction are narrow. The distributions of the inclination directions are preferably within ±5° and more preferably within ±3°.

The biaxially oriented SiC layer 30 has pores 32 and defects 34. The presence of the plurality of pores 32 contributes to a significant reduction in the number of defects 34 in the oriented layer. Although the mechanism of this effect is unclear, possible mechanisms include relaxation of thermal stress by the pores 32, annihilation of pores 32 and defects 34 colliding with each other, relaxation of stress caused by a lattice mismatch, etc.

Preferably, the pores 32 are present so as not to have openings on a surface 30b of the biaxially oriented SiC layer 30. Specifically, the biaxially oriented SiC layer 30 has the pores 32 thereinside but has no pores 32 having openings on the surface 30b. When pores 32 having openings on the surface 30b are present, it is difficult to deposit an epitaxial film, etc. on the biaxially oriented SiC layer 30.

As for the number of pores 32 in the biaxially oriented SiC layer 30, it is preferable that the number of pores Ns in a surface layer region including the surface 30b opposite to the contact surface 30a is smaller than the number of pores Nd in a deep layer region including a contact surface 30a between the biaxially oriented SiC layer 30 and the SiC single crystal layer 20, as shown in FIG. 2. In this case, the number of threading defects reaching the surface 30b can be effectively reduced. Although the reason for this is unclear, it is inferred that the above pore distribution facilitates relaxation of the thermal stress etc. It is only necessary that the surface layer region and the deep layer region are determined in a relative sense in terms of the depth and the pore distribution, and it is unnecessary to determine these regions using the depth in an absolute sense. For example, the surface layer region is a region extending from the surface of the biaxially oriented SiC layer 30 to a depth of 50% with respect to the thickness of the biaxially oriented SiC layer 30, and the deep layer region is a region located below the surface layer region and having a depth of 50%. For example, when the thickness of the biaxially oriented SiC layer 30 is 50 μm, the surface layer region is a region extending from the surface 30b of the biaxially oriented SiC layer 30 to a depth of 25 μm, and the deep layer region is a region extending from a depth of m to a depth of 50 μm. The number of pores Nd in the deep layer region and the number of pores Ns in the surface layer region can each be defined as follows. A surface (cross section) of the biaxially oriented SiC layer 30 that is orthogonal to the surface (plate surface) 30b is observed, and the number of pores per unit area, i.e., the number of pores/cm$^2$, in the cross section is determined.

No particular limitation is imposed on the number of pores Nd in the deep layer region. However, if the number of pores Nd is excessively large, the biaxially oriented SiC layer 30 tends to be cracked during processing such as cutting or surface polishing. Therefore, from the viewpoint of ease of processing, the number of pores Nd is preferably $1\times10^8$/cm$^2$ or less and more preferably $1\times10^7$/cm$^2$ or less. If the number of pores Nd is excessively small, it is difficult to reduce the density of the defects 34. Therefore, from the viewpoint of reducing the number of defects, the number of pores Nd is preferably $1\times10^2$/cm$^2$ or more, more preferably $1\times10^3$/cm$^2$ or more, yet more preferably $1\times10^5$/cm$^2$ or more, and still more preferably $1\times10^6$/cm$^2$ or more. No particular limitation is imposed on the number of pores Ns in the surface layer region in the biaxially oriented SiC layer 30. However, if the number of pores Ns is excessively large, the biaxially oriented SiC layer 30 tends to be cracked during processing such as cutting or surface polishing. Therefore, from the viewpoint of ease of processing, the number of pores Ns is preferably $1\times10^8$/cm$^2$ or less and more preferably $1\times10^7$/cm$^2$ or less. If the number of pores Ns is excessively small, it is difficult to reduce the density of the defects 34. Therefore, from the viewpoint of reducing the number of defects, the number of pores Nd is preferably $1\times10^2$/cm$^2$ or more, more preferably $1\times10^3$/cm$^2$ or more, yet more preferably $1\times10^4$/cm$^2$ or more, and still more preferably $1\times10^5$/cm$^2$ or more. The ratio Nd/Ns is preferably 1 to 10, more preferably 1 to 9, and particularly preferably 4 to 9. In this manner, the number of threading defects reaching the surface 30b can be efficiently reduced.

The density of defects reaching the surface 30b of the biaxially oriented SiC layer 30 is $1\times10^1$/cm$^2$ or less. The defect density is measured by evaluating etch pits using well-known etching with molten KOH. In the present description, the defects include threading screw dislocations (TSDs), basal plane dislocations (BPDs), and micropipes (MPs). The term "threading" means that the dislocation line is substantially parallel to the [0001] axis of the hexagonal system. The term "basal" means that the dislocation line is in the (0001) plane of the basal hexagonal system. The micropipes are hollow-core TSDs with the Burgers vector exceeding 3c. Here, c is the lattice constant.

From the viewpoint of imparting electric conductivity in the thickness direction to the SiC composite substrate 10, it is preferable that the biaxially oriented SiC layer 30 and the SiC single crystal layer 20 are layers having a low resistivity, and the resistivity is typically 20 µmΩcm. The biaxially oriented SiC layer 30 and the SiC single crystal layer 20 that have a low resistance are preferably n-type SiC layers doped with nitrogen. The SiC composite substrate 10 including the SiC single crystal layer 20 and the biaxially oriented SiC layer 30 that have the above-described electrical conductivity can be used as a substrate for a vertical device (e.g., a power device) having electrical conductivity in the thickness direction. The biaxially oriented SiC layer 30 and the SiC single crystal layer 20 may each be p-type SiC in some applications. In this case, it is preferable that the biaxially oriented SiC layer 30 and the SiC single crystal layer 20 are doped with Al, B, etc.

From the viewpoint of imparting insulation properties in the thickness direction to the SiC composite substrate 10, the biaxially oriented SiC layer 30 is preferably a layer having a high resistivity, and the resistivity is typically $1 \times 10^7 \Omega cm$ or more. For example, the biaxially oriented SiC layer 30 having a high resistivity is a layer containing no dopant elements. Even when an n-type dopant and also a p-type dopant are contained, the high resistance described above can be obtained. The SiC composite substrate 10 including the biaxially oriented SiC layer 30 having the insulating properties described above can be used as an insulating base substrate for a horizontal device (e.g., a high-frequency power device including the SiC composite substrate and GaN and AlGaN layers etc. deposited thereon).

Next, a method for producing the SiC composite substrate 10 will be described. In the following description, the biaxially oriented SiC layer 30 is produced on the SiC single crystal layer 20. Specifically, the method includes (a) the step of forming an unoriented precursor layer 40, (b) a heat treatment step, and (c) a grinding step. The unoriented precursor layer 40 later becomes the biaxially oriented SiC layer 30 through the heat treatment described later and may contain components such as a dopant. These steps will be described in order using FIGS. 3A to 3C.

(a) Step of Forming Unoriented Precursor Layer 40 (See FIG. 3A)

In the step of forming the unoriented precursor layer 40, the unoriented precursor layer 40 is formed on the crystal growth face of the SiC single crystal layer 20. The SiC single crystal layer 20 used is preferably the 4H or 6H polytype. The crystal growth face of the SiC single crystal layer 20 is preferably the Si-face with an off-angle of 0.1 to 12° with respect to the SiC [0001] axis. The off-angle is more preferably 1 to 5°.

No particular limitation is imposed on the method for forming the unoriented precursor layer 40 so long as the biaxially oriented SiC layer 30 having pores 32 is formed through the heat treatment, and any known method can be used. The pores 32 may be formed in the unoriented precursor layer 40, or the unoriented precursor layer 40 may be dense. In this case, the pores 32 may be generated during the formation of the biaxially oriented SiC layer 30. However, from the viewpoint of controlling the state of the pores 32 formed, it is preferable that the pores 32 have been formed in the unoriented precursor layer 40. Examples of the method for forming the unoriented precursor layer 40 include: solid phase deposition methods such as an AD (aerosol deposition) method and an HPPD (hypersonic plasma particle deposition) method; vapor phase deposition methods such as a sputtering method, a vapor deposition method, a sublimation method, and various CVD (chemical vapor deposition) methods; and liquid phase deposition methods such as a solution growth method. Any method in which the unoriented precursor layer is formed directly on the SiC single crystal substrate can be used. The CVD method that can be used is, for example, a thermal CVD method, a plasma CVD method, a mist CVD method, or a MO (metal organic) CVD method. A method including using, as the unoriented precursor layer 40, a polycrystalline body produced in advance by, for example, any of a sublimation method, sintering, and various CVD methods and placing the polycrystalline body on the SiC single crystal layer 20 may be used. In this case also, it is preferable that the polycrystalline body contains pores thereinside. Alternatively, a method including producing a shaped body for the unoriented precursor layer 40 in advance and placing the shaped body on the SiC single crystal layer 20 may be used. Such an unoriented precursor layer 40 may be a tape-cast body produced by tape casting or a compact formed by compression molding such as uniaxial pressing.

The unoriented precursor layer 40 may contain a component for controlling the electrical properties of the biaxially oriented SiC layer 30. For example, when the biaxially oriented SiC layer 30 formed is of the n-type, the unoriented precursor layer 40 may contain nitrogen. When the biaxially oriented SiC layer 30 formed is of the p-type, the unoriented precursor layer 40 may contain B or Al. To impart insulating properties to the biaxially oriented SiC layer 30, the unoriented precursor layer 40 may contain nitrogen and B and/or Al.

When any of the various CVD methods, the sublimation method, and the solution growth method is used to form the unoriented precursor layer 40 directly on the SiC single crystal layer 20, epitaxial growth may occur on the SiC single crystal layer 20, so that the biaxially oriented SiC layer 30 may be deposited without the heat treatment step described later. However, it is preferable that the as-formed unoriented precursor layer 40 is not oriented, i.e., is an amorphous or unoriented polycrystal, and is oriented in the subsequent heat treatment step using the SiC single crystal as a seed. In this manner, the number of crystal defects reaching the surface 30b of the biaxially oriented SiC layer 30 can be effectively reduced. Although the reason for this is unclear, it may be considered that the rearrangement of the crystal structure of the deposited unoriented solid precursor layer using the SiC single crystal as a seed is effective for annihilation of crystal defects. Therefore, when any of the various CVD methods, the sublimation method, the solution growth method, etc. is used, it is preferable to select conditions that do not cause epitaxial growth in the step of forming the unoriented precursor layer 40.

However, it is preferable to use the method in which the unoriented precursor layer 40 is formed directly on the SiC single crystal layer 20 using any of the aerosol deposition (AD) method and the various CVD methods or the method in which the polycrystalline body produced separately using any of the sublimation method, the various CVD methods, and sintering is placed on the SiC single crystal layer 20. By using any of the above methods, the unoriented precursor layer 40 can be formed in a relatively short time. The AD method is particularly preferable because it does not need a high-vacuum process and its deposition rate is relatively high. In the method in which the polycrystalline body produced in advance is used as the unoriented precursor layer 40, some contrivance such as sufficient smoothening of the surface of the polycrystalline body is necessary in order to increase the adhesion between the polycrystalline body and the SiC single crystal layer 20. Therefore, it is preferable, from the viewpoint of cost, to use the method in which the unoriented precursor layer 40 is formed directly. The method in which the shaped body produced in advance is placed on the SiC single crystal layer 20 is also preferable because it is a simple method. However, since the unoriented precursor layer 40 is formed from a powder, a process for sintering the power is required in the heat treatment step described later. In any of the above methods, well-known conditions can be used. Next, the method in which the unoriented precursor layer 40 is formed directly on the SiC single crystal layer 20 using the AD method or the thermal CVD method and the method in which the shaped body produced in advance is placed on the SiC single crystal layer 20 will be described.

Figure 4:
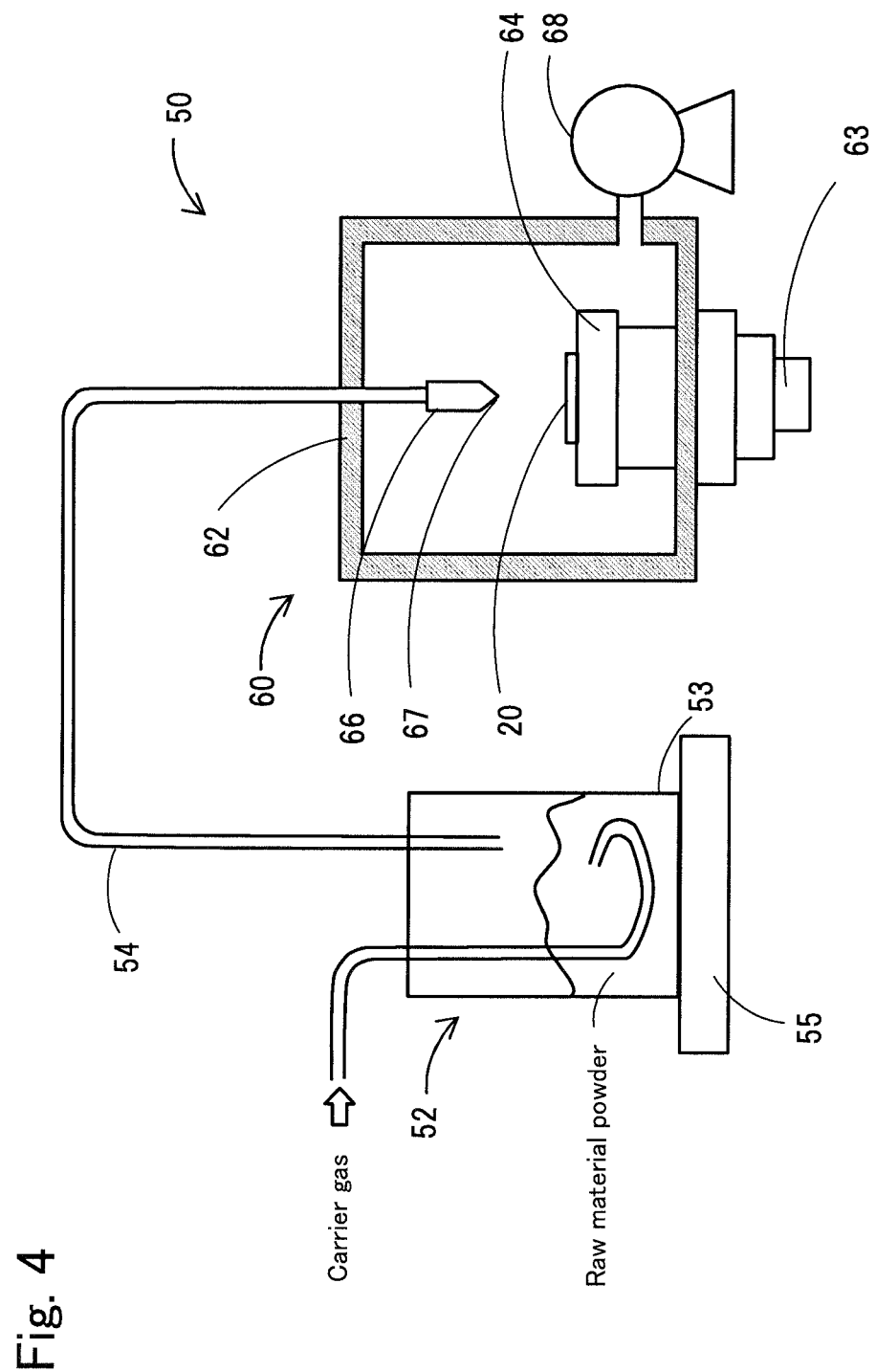
FIG. 4 is a conceptual diagram of a deposition device 50.

The AD method is a technique for forming a coating by mixing fine particles or a raw material of the fine particles with a gas to form an aerosol and ejecting the aerosol at high speed from a nozzle onto a substrate to cause the aerosol to collide with the substrate, and one feature of the AD method is that the coating can be formed at room temperature. FIG. 4 shows an example of a deposition device (aerosol deposition (AD) device) used for the AD method. The deposition device 50 shown in FIG. 4 is configured as a device used for the AD method in which a raw material powder is ejected onto a substrate in a low-pressure atmosphere having a pressure lower than the atmospheric pressure. The deposition device 50 includes: an aerosol generation unit 52 that generates an aerosol of the raw material powder containing the raw material component; and a deposition unit 60 configured to eject the raw material powder onto the SiC single crystal layer 20 to form a film containing the raw material component. The aerosol generation unit 52 includes: an aerosol generation chamber 53 that houses the raw material powder and is configured to generate the aerosol using a carrier gas supplied from an unillustrated gas cylinder; a raw material supply pipe 54 configured to supply the generated aerosol to the deposition unit 60; and a vibrator 55 that vibrates the aerosol generation chamber 53 and the aerosol therein at a frequency of 10 to 100 Hz. The deposition unit 60 includes: a deposition chamber 62 in which the aerosol is ejected onto the SiC single crystal layer 20; a substrate holder 64 that is disposed inside the deposition chamber 62 and fixes the SiC single crystal layer 20; and an X-Y stage 63 that moves the substrate holder 64 in the X axis and Y axis directions. The deposition unit 60 further includes: an ejection nozzle 66 that has a slit 67 at its forward end and ejects the aerosol onto the SiC single crystal layer 20; and a vacuum pump 68 that evacuates the deposition chamber 62. The ejection nozzle 66 is attached to the forward end of the raw material supply pipe 54.

It is known that, with the AD method, pores are formed in the film or the film is in the form of a compact, but this depends on the deposition conditions. For example, the AD method is easily affected by the collision speed of the raw material powder with the substrate, the particle diameter of the raw material powder, the aggregation state of the raw material powder in the aerosol, the ejection amount per unit time, etc. The collision speed of the raw material powder with the substrate is influenced by the difference in internal pressure between the deposition chamber 62 and the ejection nozzle 66, the opening area of the ejection nozzle, etc. Therefore, to control the number of pores in the unoriented precursor layer 40, it is necessary to control these factors appropriately.

In the thermal CVD method, a well-known deposition device such as a commercial deposition device can be used. No particular limitation is imposed on the raw material gases. Silicon tetrachloride ($SiCl_4$) gas or silane ($SiH_4$) gas can be used as the supply source of Si, and methane ($CH_4$) gas, propane ($C_3H_8$) gas, etc. can be used as the supply source of C. The deposition temperature is preferably 1000 to 2200° C., more preferably 1100 to 2000° C., and still more preferably 1200 to 1900° C.

It is known that, when the thermal CVD method is used for deposition on the SiC single crystal layer 20, epitaxial growth occurs on the SiC single crystal layer 20, so that the biaxially oriented SiC layer 30 may be formed. However, it is preferable that the as-produced unoriented precursor layer 40 is not oriented, i.e., is an amorphous or unoriented polycrystal, and subjected to the heat treatment step to cause rearrangement of the crystals using the SiC single crystal as a seed crystal. It is known that, when the thermal CVD method is used to form the amorphous or polycrystalline layer on the SiC single crystal, the formation is influenced by the deposition temperature, the flow rates of Si and C source gases, their ratio, the deposition pressure, etc. The influence of the deposition temperature is large. The lower the deposition temperature, the better from the viewpoint of forming the amorphous or polycrystalline layer. The deposition temperature is preferably lower than 1700° C., more preferably 1500° C. or lower, and particularly preferably 1400° C. or lower. However, if the deposition temperature is excessively low, the deposition rate itself is reduced. Therefore, the higher the deposition temperature, the better from the viewpoint of the deposition rate. The thermal CVD method is known as a method for forming a dense film, irrespective of whether the film is an epitaxial film or a polycrystalline film. However, by controlling the ratio of the flow rates of the Si and C source gases and the deposition pressure, pores can be formed in the film. For example, by increasing the ratio Si/C of the Si source to the C source, aggregates of Si are formed in the film. The aggregates evaporate during deposition and the heat treatment in the subsequent step, and pores 32 are thereby formed. By reducing the Si/C ratio, pores 32 are also formed in the biaxially oriented SiC layer 30. Therefore, to form a polycrystalline or amorphous unoriented precursor layer 40 including pores 32 using the thermal CVD method, it is necessary to appropriately control all the factors such as the deposition temperature, the Si/C ratio, the total pressure, etc.

When the shaped body including the unoriented precursor layer 40 produced in advance is used, the shaped body can be formed by shaping the raw material powder of the unoriented precursor. For example, when press forming is used, the unoriented precursor layer 40 is a press-formed body. The press-formed body can be produced by subjecting the raw material powder of the unoriented precursor to press forming using a well-known method. For example, the press-formed body may be produced by placing the raw material powder in a mold and pressing the raw material powder at a pressure of preferably 100 to 400 $kgf/cm^2$ and more preferably 150 to 300 $kgf/cm^2$. No particular limitation is imposed on the molding method. In addition to the press forming, tape casting, extrusion molding, casting, a doctor blade method, or any combination thereof can be used. When, for example, tape casting is used, it is preferable to use the following procedure. Additives such as a binder, a plasticizer, a dispersant, and a dispersion medium are appropriately added to the raw material powder to prepare a slurry. Then the slurry is caused to pass through a narrow slit-shaped ejection hole, and the ejected slurry is thereby formed into a sheet shape. No particular limitation is imposed on the thickness of the sheet-shaped cast body. From the viewpoint of handleability, the thickness is preferably 5 to 500 µm. When a thick unoriented precursor layer is necessary, a plurality of sheet-shaped cast bodies are stacked to obtain the desired thickness. When any of the above shaped bodies is used, the shaped body is later subjected to heat treatment on the SiC single crystal layer 20, and a portion near the SiC single crystal layer 20 is transformed to the biaxially oriented SiC layer 30. In this method, it is necessary to sinter the shaped body in the heat treatment step described later. It is preferable that the biaxially oriented SiC layer 30 is formed after the step of sintering the shaped body to integrate the polycrystalline body and the SiC single crystal layer 20 together. If the shaped body does not experience the sintered state, epitaxial growth using the SiC single crystal as a seed may be insufficient. Therefore, the shaped body may contain additives such as a sintering aid in addition to the SiC raw materials. However, it is also necessary that pores 32 be formed in the biaxially oriented SiC layer 30, and it is necessary to select additives and heat treatment conditions that allow both the epitaxial growth and the formation of pores.

(b) Heat Treatment Step (See FIG. 3B)

In the heat treatment step, a stacked body including the unoriented precursor layer 40 stacked or placed on the SiC single crystal layer 20 is subjected to heat treatment to form the biaxially oriented SiC layer 30. No particular limitation is imposed on the heat treatment method so long as epitaxial growth using the SiC single crystal layer 20 as a seed occurs. The heat treatment method can be performed in a well-known heat treatment furnace such as a tubular furnace or a hot plate. In addition to the heat treatment at normal pressure (treatment without pressing), heat treatment under pressure such as hot pressing or HIP or a combination of the heat treatment at normal pressure and the heat treatment under pressure may be used. The atmosphere during the heat treatment can be selected from a vacuum atmosphere, a nitrogen atmosphere, and an inert gas atmosphere. The heat treatment temperature is preferably 1700 to 2700° C. When the temperature is high, the unoriented precursor layer 40 can easily grow while oriented along the c-axis and a-axis with the SiC single crystal layer 20 serving as a seed crystal. Therefore, the temperature is preferably 1700° C. or higher, more preferably 1850° C. or higher, still more preferably 2000° C. or higher, and particularly preferably 2200° C. or higher. If the temperature is excessively high, part of SiC may be lost by sublimation, or SiC may plastically deform, so that problems such as warpage may occur. Therefore, the temperature is preferably 2700° C. or lower and more preferably 2500° C. or lower. The heat treatment temperature and the holding time are related to the thickness of the biaxially oriented SiC layer 30 formed by the epitaxial growth and can be controlled appropriately.

When the shaped body produced in advance is used as the unoriented precursor layer 40, the shaped body must be sintered during the heat treatment. Therefore, normal pressure sintering at high temperature, hot pressing, HIP, or a combination thereof is preferred. When, for example, hot pressing is used, the contact pressure is preferably 50 kgf/cm$^2$ or more, more preferably 100 kgf/cm$^2$ or more, and particularly preferably 200 kgf/cm$^2$ or more, and the upper limit of the contact pressure is not particularly specified. No particular limitation is imposed on the firing temperature, so long as sintering and epitaxial growth occur. The firing temperature is preferably 1700° C. or higher, more preferably 1800° C. or higher, still more preferably 2000° C. or higher, and particularly preferably 2200° C. or higher. The atmosphere during firing can be selected from a vacuum atmosphere, a nitrogen atmosphere, an inert atmosphere, and a mixture of nitrogen and an inert gas. The SiC powder used as a raw material may be α-SiC or β-SiC. Preferably, the SiC powder is formed from SiC particles having an average particle diameter of 0.01 to 5 m. The average particle diameter means the average value of the maximum unidirectional particle diameters of 100 primary particles obtained when the powder is observed under a scanning electron microscope.

In the heat treatment step, crystals in the unoriented precursor layer 40 grow from the crystal growth face of the SiC single crystal layer 20 while oriented along the c-axis and a-axis. Therefore, the unoriented precursor layer 40 is gradually transformed into the biaxially oriented SiC layer 30 on the crystal growth face. In the biaxially oriented SiC layer 30 formed, the density of defects is $1 \times 10^1$/cm$^2$ or less. The reasons that the defect density is significantly low may be as follows. First, thermal stress in the biaxially oriented SiC layer 30 may be one cause of the formation of dislocations. However, since the pores are present in the unoriented precursor layer 40, the thermal stress during the formation of the biaxially oriented SiC layer 30 is relaxed, and the number of dislocations due to the thermal stress may thereby be reduced. Second, although defects in the SiC single crystal layer 20 propagate into the biaxially oriented SiC layer 30, the propagating defects 34 may collide with the pores 32 in the unoriented precursor layer 40 and thereby annihilate, or pair annihilation of defects may occur because thermal stress in the biaxially oriented SiC layer 30 is small, so that the number of defects 34 is reduced.

When the Si-face with the off angle described above is used as the crystal growth face of the SiC single crystal layer 20, the number of defects in the biaxially oriented SiC layer 30 is effectively reduced also in this case. The detailed mechanism of this is unclear but may be as follows. In the initial stage, islands of a crystal growth layer are formed on the crystal growth face of the SiC single crystal layer 20 serving as a seed crystal, and then the crystal growth layer grows in in-plane directions (for example, a-axis directions). Therefore, as the crystals grow in the in-plane directions, threading defects are also bent in the in-plane directions, so that no defects may propagate in the thickness direction. When the crystal growth face of the seed crystal has an off-angle, the number of defects is reduced, and polytypes are controlled. In this case, the biaxially oriented SiC layer 30 having a large thickness can be grown. Therefore, the off-angle is 0.1° or more, preferably 1° or more, more preferably 3° or more, still more preferably 5° or more, and particularly preferably 7° or more. If the off-angle is excessively large, the behavior of crystal growth is changed, and defects 34 may propagate in the thickness direction. Therefore, from the viewpoint of reducing the number of defects, the off-angle is 12° or less, preferably 9° or less, more preferably 7° or less, and still more preferably 5° or less.

(C) Grinding Step (See FIG. 3C)

In the grinding step, the unoriented precursor layer 40 remaining on the biaxially oriented SiC layer 30 after an annealing step is ground and removed to expose the surface of the biaxially oriented SiC layer 30, and the exposed surface is polished using diamond abrasive grains and subjected to CMP (chemical-mechanical polishing) treatment. The SiC composite substrate 10 is obtained in the manner described above.

The biaxially oriented SiC layer 30 in the SiC composite substrate 10 in the present embodiment described above has a significantly small defect density and is therefore useful for production of semiconductor devices and electronic devices.

As for the number of pores 32 in the biaxially oriented SiC layer 30, when the number of pores Ns in the surface layer region including the surface 30b opposite to the contact surface 30a is smaller than the number of pores Nd in the deep layer region including the contact surface 30a between the biaxially oriented SiC layer 30 and the SiC single crystal layer 20, the number of threading defects can be effectively reduced.

Figure 5:
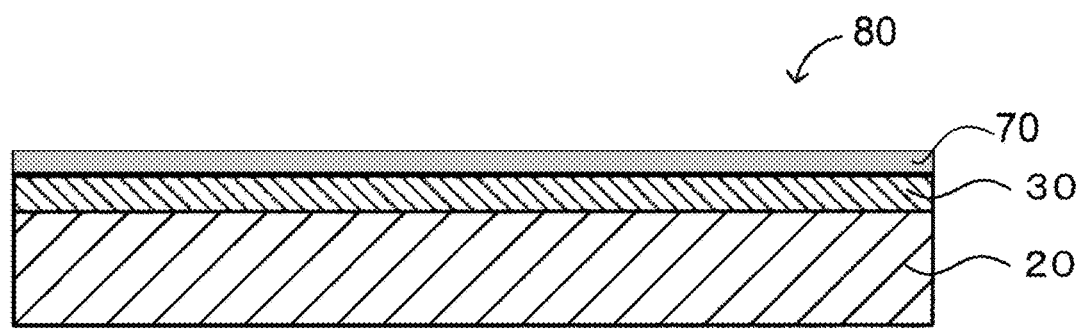
FIG. 5 is a vertical cross-sectional view of a semiconductor device 80 formed using the composite substrate 10.

FIG. 5 is a semiconductor device 80 that can be produced by providing a functional layer 70 for the semiconductor device on the biaxially oriented SiC layer 30. Examples of the semiconductor device include MOSFETs, IGBTs, and LEDs.

It is understood that the present invention is not limited to the embodiment described above in any way and may be carried out in various modes so long as they fall within the technical scope of the present invention.

In the embodiments described above, only one biaxially oriented SiC layer 30 is disposed on the SiC single crystal layer 20. However, two or more biaxially oriented SiC layers 30 may be disposed. Specifically, an unoriented precursor layer 40 may be stacked on the biaxially oriented SiC layer 30 of the SiC composite substrate 10 and subjected to heat treatment, annealing, and grinding in this order to thereby form a second biaxially oriented SiC layer 30 on the biaxially oriented SiC layer 30.

EXAMPLES

Examples of the present invention will next be described. Experimental Examples 1 to 4 below correspond to Examples of the present invention. The following Examples do not limit the invention in any manner.

Experimental Example 1

1. Production of SiC Composite Substrate 10

(1) Production of Unoriented Precursor Layer 40

Using a commercial fine β-SiC powder (volume-based $D_{50}$: 0.7 μm) as a raw material powder and a commercial SiC single crystal substrate (n-type 4H—SiC, diameter: 50.8 μmm (2 inches), Si-face, (0001) plane, off-angle: 4°, thickness: 0.35 μmm, no orientation flat) as a substrate, an AD film was formed on the SiC single crystal substrate using the AD deposition device 50 shown in FIG. 4.

The AD deposition conditions are as follows. The carrier gas was $N_2$, and the film was formed using a ceramic-made nozzle having a slit with a long side length of 5 μmm×a short side length of 0.4 μmm. The scanning conditions for the nozzle are as follows. The rate of scanning was 0.5 mm/s. In the scanning performed, the nozzle was moved 55 μmm in a forward direction perpendicular to the long sides of the slit, moved 5 μmm in the long side direction of the slit, moved 55 μmm in a backward direction perpendicular to the long sides of the slit, and moved 5 μmm in the long side direction of the slit toward the side opposite to the initial position. After the nozzle had been moved 55 μmm from the initial position in the long side direction of the slit, the scanning direction was reversed, and the nozzle was returned to the initial position. The above cyclic operation is defined as one cycle and was repeated 100 times. During each deposition cycle at room temperature, the pressure of the carrier gas was set to 0.06 MPa, and the flow rate of the carrier gas was set to 6 L/min. The pressure inside the chamber was adjusted to 100 Pa or lower. The thickness of the thus-formed AD film was about 10 μm, and this film was used as an AD film 1.

Next, an AD film 2 was produced on the AD film 1 under the same conditions as those for the AD film 1 except that the nozzle was replaced with a ceramic-made nozzle having a slit with a long side length of 5 μmm×a short side length of 0.3 μmm and that the number of cycles was changed to 500. The thickness of the thus-formed AD film 2 was about 50 μm. In the AD film obtained, the total thickness of the AD films 1 and 2 was about 60 μm. Both the AD films 1 and 2 contain pores, and the number of pores per unit area was smaller in the AD film 2 than in the AD film 1.

(2) Heat Treatment of Unoriented Precursor Layer 40

The SiC substrate with the AD film formed thereon was removed from the AD device and annealed in an argon atmosphere at 2400° C. for 5 hours.

(3) Measurement of Crystal Growth Thickness

A specimen produced separately by the same methods as in (1) and (2) was prepared and cut in a direction orthogonal to the plate surface along a line passing through a central portion of the substrate. The cut specimen was subjected to lapping using diamond abrasive grains to smoothen its cross section and then subjected to chemical-mechanical polishing (CMP) to a mirror finish using colloidal silica. An image of the resulting cross section was taken under a scanning electron microscope (SU-5000 manufactured by Hitachi High-Technologies Corporation). By observing the backscattered electron image of the polished cross section, the thickness of a polycrystalline portion was estimated using channeling contrast due to differences in crystal orientation. Since the crystal orientation was uniform in both the biaxially oriented SiC layer 30 and the SiC single crystal layer 20, it was difficult to distinguish them from each other using the channeling contrast. Therefore, the thickness of the SiC single crystal layer 20 (0.35 μmm) was extracted from the thickness of a region with uniform crystal orientation (an oriented crystalline portion) to determine the thickness of the biaxially oriented SiC layer 30. The thickness of the polycrystalline portion was about 30 μm, and the thickness of the biaxially oriented SiC layer was about 30 μm.

(4) Grinding and Polishing

The specimen produced through (1) and (2) was fixed to a metal platen, and the plate surface of the specimen was ground and flattened using grindstones including a finest #1200 grindstone. Next, the plate surface was subjected to lapping using diamond abrasive grains to smoothen the plate surface. Then the plate surface was subjected to chemical-mechanical polishing (CMP) to a mirror finish using colloidal silica. The plate surface was ground and polished such that the total grinding/polishing amount was about 40 μm, and the arithmetic mean roughness Ra of the resulting plate surface was 0.1 μmm. The SiC composite substrate 10 was thereby obtained. Using the total processing amount and the results of the observation in (3), the thickness of the biaxially oriented SiC layer 30 formed on the SiC composite substrate 10 was computed to be about 20 μm.

2. Evaluation (1) Crystal orientation of biaxially oriented SiC layer 30

The SiC composite substrate 10 produced in 1. was cut along a line extending in a direction orthogonal to the plate surface and passing through a central portion of the substrate. The cross section of the cut specimen was subjected to lapping using diamond abrasive grains to smoothen the cross section and subjected to chemical-mechanical polishing (CMP) to a mirror finish using colloidal silica. Next, the EBSD (Electron Back Scatter Diffraction Patterns) method was used to measure the inverse pole figure map of the cross section of the biaxially oriented SiC layer 30. Specifically, a scanning electron microscope (SU-5000 manufactured by Hitachi High-Technologies Corporation) equipped with an EBSD system (Nordlys Nano manufactured by Oxford Instruments) was used to perform the inverse pole figure mapping of the cross section of the biaxially oriented SiC layer 30 in a viewing area of 50 μm×100 μm under the following conditions.

<EBSD Measurement Conditions>
Acceleration voltage: 15 kv
Spot intensity: 70
Working distance: 22.5 μmm
Step side: 0.5 μm
Specimen inclination angle: 70°
Measurement program: Aztec (version 3.3)

It was found from the inverse pole figure map of the cross section that the biaxially oriented SiC layer 30 was oriented similarly to the SiC single crystal layer 20 in both the direction normal to the surface and the plate surface direction. The distributions of inclination angles with respect to the substantially normal direction and the substantially plate surface direction were within ±0.5°, and the presence of the biaxially oriented SiC layer 30 was confirmed.

(2) Number of Pores

A scanning electron microscope (SU-5000 manufactured by Hitachi High-Technologies Corporation) was used to take secondary electron images in an arbitrary region in a cross section of a specimen of the biaxially oriented SiC layer 30 (thickness: about 20 μm) at a measurement magnification of 500×. Specifically, the secondary electron images of 25 viewing areas (size of each viewing area: 178 μm×256 μm) were taken, and the number of pores Nd in the deep layer region of the biaxially oriented SiC layer 30 (the region extending from the interface with the SiC single crystal layer and having a thickness of about 10 μm) and the number of pores Ns contained in the surface layer region (the region extending from the surface of the biaxially oriented SiC layer and having a thickness of about 10 μm) were evaluated. Pores having a pore diameter of 0.3 μm or more were counted. Specifically, the number of pores in the secondary electron images taken was counted visually, and the number of pores per unit cross-sectional area was evaluated. The results are shown in Table 1.

(3) Defect Density of Biaxially Oriented SiC Layer 30

A commercial SiC single crystal substrate that was the same type of substrate used in the present Experimental Example (a different substrate in the same lot) and the SiC composite substrate 10 produced in 1 above were used as evaluation samples. Each of the evaluation samples, together with KOH crystals, was placed in a nickel-made crucible and subjected to etching treatment in an electric furnace at 500° C. for 10 μminutes. Each evaluation sample subjected to the etching treatment was washed. Then the etched surface was observed under an optical microscope, and the number of pits was counted. Specifically, images of 100 viewing areas having a length of 2.3 μmm×a width of 3.6 μmm in an arbitrary region of the surface of the evaluation sample were taken at a magnification of 50X, and the total number of pits was counted. The total number of pits counted was divided by a total area of 8.05 cm$^2$ to compute the defect density. The defect densities of the commercial SiC single crystal substrate and the biaxially oriented SiC layer 30 in the present Experimental Example were 1.0× 10$^3$/cm$^2$ and 3.1×10$^0$/cm$^2$, respectively.

Experimental Example 2

SiC composite substrates 10 were produced and evaluated as described in Experimental Example 1 except that, in 1.(1) above, a ceramic-made nozzle having a slit with a long side length of 5 μmm×a short side length of 0.3 μmm was used for the AD film 1 and that a ceramic-made nozzle having a slit with a long side length of 5 μmm×a short side length of 0.2 mm was used for the AD film 2. The formation of the biaxially oriented SiC layer 30 having the same thickness as that in Experimental Example 1 was confirmed. The numbers of pores and the results of the defect density evaluation are as shown in Table 1.

Experimental Example 3

SiC composite substrates 10 were produced and evaluated as described in Experimental Example 1 except that, in 1.(1) above, a ceramic-made nozzle having a slit with a long side length of 5 μmm×a short side length of 0.1 μmm was used for the AD film 1 and that a ceramic-made nozzle having a slit with a long side length of 5 μmm×a short side length of 0.15 μmm was used for the AD film 2. The formation of the biaxially oriented SiC layer 30 having the same thickness as that in Experimental Example 1 was confirmed. The numbers of pores and the results of the defect density evaluation are as shown in Table 1.

Experimental Example 4

SiC composite substrates 10 were produced and evaluated as described in Experimental Example 1 except that, in 1.(1) above, a ceramic-made nozzle having a slit with a long side length of 5 μmm×a short side length of 0.3 μmm was used for the AD film 1 and that a ceramic-made nozzle having a slit with a long side length of 5 μmm×a short side length of 0.4 mm was used for the AD film 2. The formation of the biaxially oriented SiC layer 30 having the same thickness as that in Experimental Example 1 was confirmed. The numbers of pores and the results of the defect density evaluation are as shown in Table 1.

TABLE 1

| | Biaxially oriented SiC layer | | | |
| --- | --- | --- | --- | --- |
| Experimental Example | Number of pores Nd in the deep layer region [/cm$^2$] | Number of pores Ns in the surface layer region [/cm$^2$] | Nd/Ns | Defect density [/cm$^2$] |
| 1 | 2.7 × 10$^6$ | 3.3 × 10$^5$ | 8.2 | 3.1 × 10$^0$ |
| 2 | 3.1 × 10$^5$ | 7.6 × 10$^4$ | 4.1 | 4.3 × 10$^0$ |
| 3 | 5.0 × 10$^3$ | 6.3 × 10$^3$ | 0.8 | 9.3 × 10$^0$ |
| 4 | 3.1 × 10$^5$ | 2.5 × 10$^6$ | 0.1 | 8.1 × 10$^0$ |

Experimental Examples 1 to 4 described above all correspond to Examples of the present application. It is inferred that the presence of the pores 32 in the biaxially oriented SiC layer 30 results in a reduction in the defect density. When the number of pores Nd in the deep layer region was larger than the number of pores Ns in the surface layer region (in other words, when the ratio Nd/Ns was larger than 1), the defect density could be further reduced.

The present application claims priority from JP Patent Application No. 2019-043465 filed Mar. 11, 2019, the entire contents of which are incorporated herein by reference.

What is claimed is:

1. A SiC composite substrate comprising:
   a SiC single crystal layer; and
   at least one biaxially oriented SiC layer disposed on the SiC single crystal layer, wherein the at least one biaxially d SiC layer is oriented in both a c-axis direction and an a-axis direction, and wherein the at least one biaxially oriented SiC layer has pores and has a density of defect reaching the surface of the at least one biaxially oriented SiC layer of $1.0 \times 10^1/cm^2$ or less.

2. The SiC composite substrate according to claim 1, wherein the number of pores in the at least one biaxially oriented SiC layer is such that the number of pores Ns in a surface layer region including a surface opposite to the contact surface between the at least one biaxially oriented SiC layer and the SiC single crystal layer is smaller than the number of pores Nd in a deep layer region including a contact surface between the at least one biaxially oriented SiC layer and the SiC single crystal layer.

3. A semiconductor device comprising:
   the SiC composite substrate according to claim 1; and
   a functional layer for the semiconductor device disposed on the at least one biaxially oriented SiC layer.

4. A semiconductor device comprising:
   the SiC composite substrate according to claim 2; and
   a functional layer for the semiconductor device disposed on the at least one biaxially oriented SiC layer.

* * * * *